United States Patent
Ogasawara

(10) Patent No.: US 9,894,628 B2
(45) Date of Patent: Feb. 13, 2018

(54) CLOCK GENERATION CIRCUIT AND WIRELESS RECEIVING DEVICE

(71) Applicant: KABUSHIKI KAISHA TOSHIBA, Tokyo (JP)

(72) Inventor: Yosuke Ogasawara, Kawasaki Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/183,018

(22) Filed: Jun. 15, 2016

(65) Prior Publication Data
US 2017/0078993 A1  Mar. 16, 2017

(30) Foreign Application Priority Data
Sep. 11, 2015  (JP) .................................. 2015-180088

(51) Int. Cl.
| | |
|---|---|
| H04W 24/02 | (2009.01) |
| H04W 56/00 | (2009.01) |
| H03K 5/135 | (2006.01) |
| H03K 5/14 | (2014.01) |
| H03K 5/00 | (2006.01) |

(52) U.S. Cl.
CPC .......... *H04W 56/005* (2013.01); *H03K 5/135* (2013.01); *H03K 5/14* (2013.01); *H04W 24/02* (2013.01); *H03K 2005/00078* (2013.01)

(58) Field of Classification Search
CPC .... H04W 24/02; H04W 56/005; H03K 5/135; H03K 2005/00078
USPC ........................................................ 375/317
See application file for complete search history.

(56) References Cited

U.S. PATENT DOCUMENTS

| | | | |
|---|---|---|---|
| 7,208,988 B2 | 4/2007 | Murata et al. | |
| 7,391,246 B1* | 6/2008 | Lu .......................... | H03L 7/0805 327/153 |
| 7,680,235 B2 | 3/2010 | Sano et al. | |
| 7,777,538 B2* | 8/2010 | Abel ........................ | H03K 5/01 326/93 |
| 9,071,252 B2 | 6/2015 | Sato et al. | |
| 2006/0100801 A1* | 5/2006 | Tabatabaei ....... | G01R 31/31709 702/69 |
| 2014/0375329 A1* | 12/2014 | Van De Graaff | G01R 31/31725 324/511 |

FOREIGN PATENT DOCUMENTS

| | | |
|---|---|---|
| JP | 2001230765 A | 8/2001 |
| JP | 2004153637 A | 5/2004 |
| JP | 2005191831 A | 7/2005 |

* cited by examiner

*Primary Examiner* — Michael Neff
(74) *Attorney, Agent, or Firm* — Patterson & Sheridan, LLP

(57) ABSTRACT

A clock circuit includes a selector circuit connected to an output terminal, first, second, and third paths connected in parallel between an input terminal for receiving an input clock signal and the selector circuit, a first clock signal output from the first path being delayed with respect to a second clock signal output from the second path by a predetermined length of time, and the second clock signal being delayed with respect to a third clock signal output from the third path by the predetermined length of time, and a control circuit configured to control the selector circuit to switch among at least two of the first, second, and third clock signals.

20 Claims, 9 Drawing Sheets

Off: Normal Clock

On: Spurious Canceling Clock

CLOCK GENERATION CIRCUIT AND WIRELESS RECEIVING DEVICE

CROSS-REFERENCE TO RELATED APPLICATION

This application is based upon and claims the benefit of priority from Japanese Patent Application No. 2015-180088, filed on Sep. 11, 2015, the entire contents of which are incorporated herein by reference.

FIELD

Embodiments described herein relate generally to a clock generation circuit and a wireless receiving device having the same.

BACKGROUND

In a wireless receiving device which includes an analog circuit and a digital circuit, harmonics of a clock signal used in the digital circuit may be introduced into the analog circuit as unnecessary radiation (spurious components), causing the receiving sensitivity of the wireless receiving device to be degraded. This may cause a clock signal for a digital circuit to be generated with errors.

DETAILED DESCRIPTION

Figure 1:
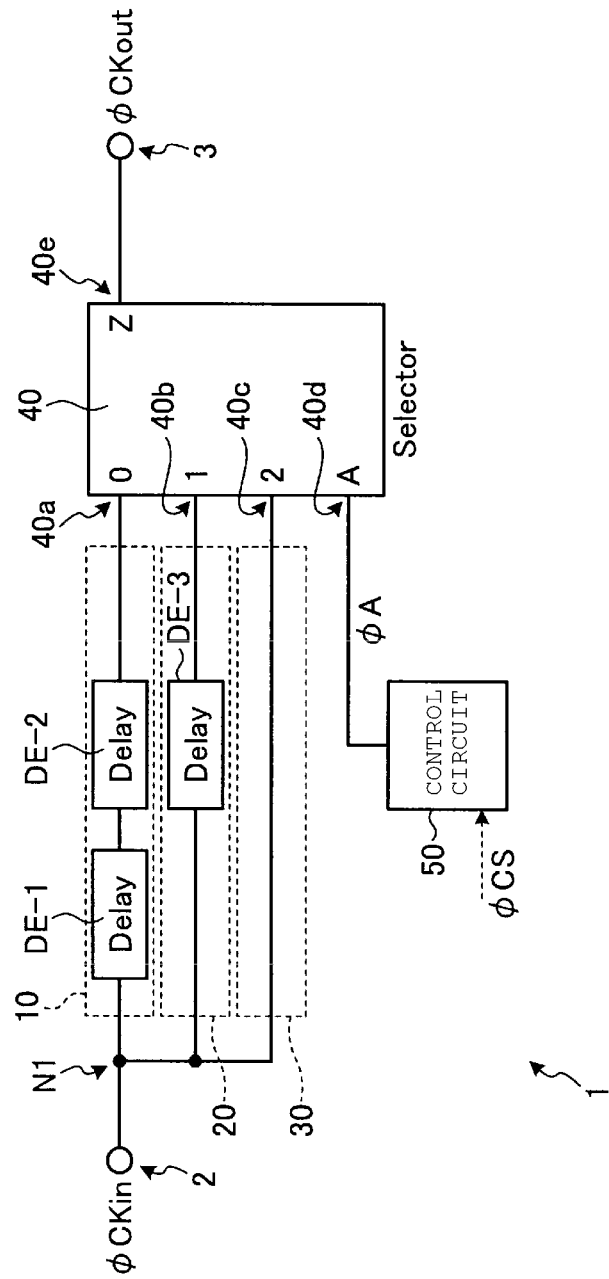
FIG. 1 is a circuit diagram illustrating a clock generation circuit according to an embodiment.

An embodiment provides a clock generation circuit and a wireless receiving device which can appropriately generate a clock signal for a digital circuit.

In general, according to an embodiment a clock circuit includes a selector circuit connected to an output terminal, first, second, and third paths connected in parallel between an input terminal for receiving an input clock signal and the selector circuit, a first clock signal output from the first path being delayed with respect to a second clock signal output from the second path by a predetermined length of time, and the second clock signal being delayed with respect to a third clock signal output from the third path by the predetermined length of time, and a control circuit configured to control the selector circuit to switch among at least two of the first, second, and third clock signals.

Hereinafter, a clock generation circuit according to the embodiment is described with reference to the drawings. The invention is not limited to the embodiment.

A clock generation circuit 1 according to the embodiment is applied to, for example, a wireless receiving device. The wireless receiving device according to wireless standards such as, M-WiMAX, or WLAN and LTE requires high receiving sensitivity in order to secure a wide communication area. In the wireless receiving device, signal processing of a reception signal received in an antenna is performed in an analog manner by an analog circuit, and signal processing of the signal in which signal processing is performed in an analog manner is performed in a digital manner by a digital circuit. In addition, miniaturization of the wireless receiving device is required, and requirements for one chip LSI of the wireless receiving device including an analog circuit and a digital circuit are increased. In the one chip LSI, spurious integer harmonics of a clock signal, which are generated by the digital circuit, leak into an analog circuit, thereby decreasing reception characteristics. For this reason, countermeasures for preventing spurious components from being generated in an analog circuit are needed.

For example, in the wireless receiving device, a digital circuit performs processing of a signal in a digital manner in synchronization with a clock signal generated by the clock generation circuit 1. At this time, if modulation in which edge timing of a clock signal to be generated by the clock generation circuit 1 is randomly changed is performed, spurious components can be diffused over the power spectrum. However, if in an aspect of a desired frequency band, the strength of spurious components cannot be reduced to a required level, then it is preferable that the strength of the spurious in the desired frequency be further reduced.

Hence, the embodiment aims to effectively cancel the spurious components in a desired frequency band by performing modulation in which the edge timing of the clock signal to be generated by the clock generation circuit 1 is delayed and/or advanced by a fixed amount corresponding to a desired frequency band.

Specifically, as illustrated in FIG. 1, the clock generation circuit 1 receives an input clock signal φCKin through an input terminal 2, and generates an output clock signal φCKout by performing modulation in which the edge timing of the input clock signal φCKin is advanced and/or delayed by a fixed amount Td corresponding to a desired frequency band FBdes. The clock generation circuit 1 outputs the generated output clock signal φCKout from an output terminal 3. FIG. 1 is a diagram illustrating a configuration of the clock generation circuit 1.

Figure 3:
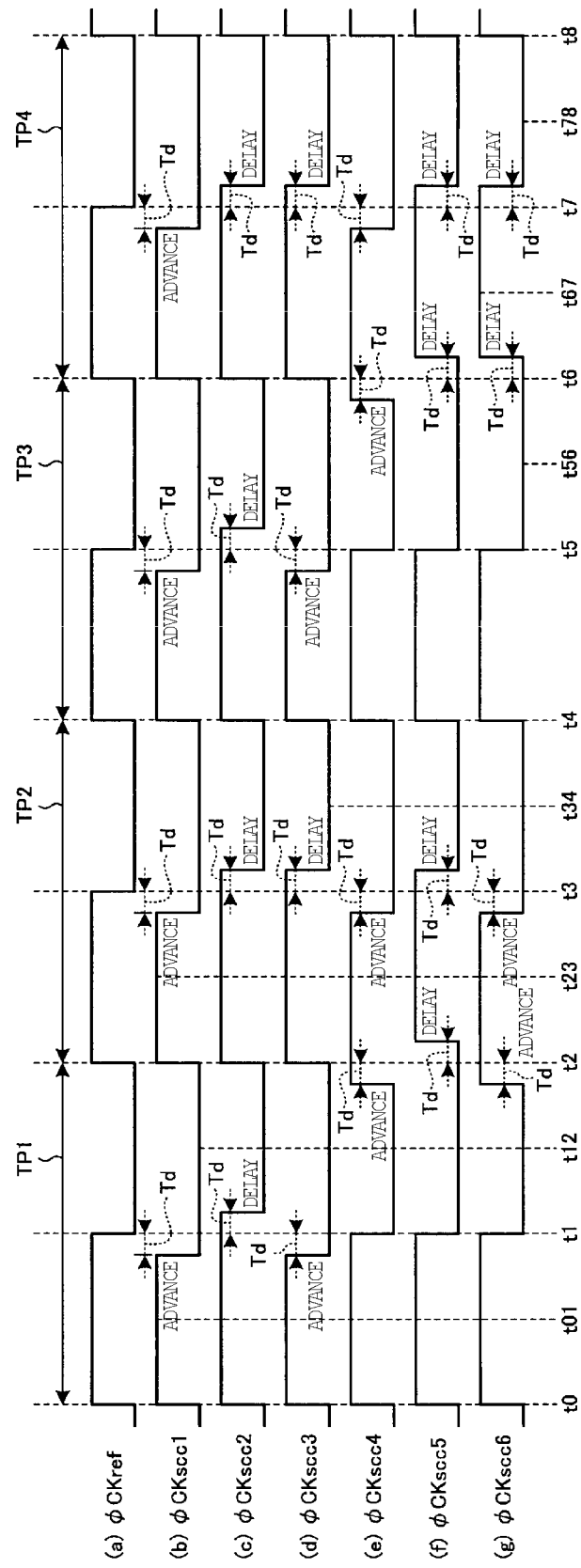
FIG. 3 is a waveform diagram illustrating an operation of the clock generation circuit according to the embodiment.

The clock generation circuit 1 performs one selected operation while periodically switching one operation which is selected from a first operation and a second operation with respect to a reference clock signal φCKref (refer to (a) of FIG. 3), and generates the output clock signal. Alternatively, the clock generation circuit 1 performs one selected operation while periodically switching one operation which is selected from the first operation and a third operation with respect to the reference clock signal φCKref, and generates the output clock signal. Alternatively, the clock generation circuit 1 performs one selected operation while periodically switching one operation which is selected from the first operation and the second operation and the third operation with respect to the reference clock signal φCKref, and generates the output clock signal. The first operation includes an operation in which the edge timing of the reference clock signal φCKref is not changed. The second operation includes an operation in which the edge timing of the reference clock signal φCKref advances by the fixed amount Td. The third operation includes an operation in which the edge timing of the reference clock signal φCKref is delayed by the fixed amount Td. For example, the clock generation circuit 1 includes multiple delay lines 10, 20, and 30, a select circuit 40, and a control circuit 50.

The multiple delay lines 10, 20, and 30 are connected between the input terminal 2 and the select circuit 40. The multiple delay lines 10, 20, and 30 receive the input clock signal φCKin, assign the amount of delay different from each other, and supply the select circuit 40, respectively.

The delay line 20 generates the reference clock signal φCKref by assigning the amount of delay D1 to the input clock signal φCKin.

The delay line 30 assigns the amount of delay D2 to the input clock signal φCKin, and generates an advanced-phase clock signal φCK(−) which is obtained by advancing the edge timing by the fixed amount Td with respect to the reference clock signal φCKref. The amount of delay D2 is less than the amount of delay D1 by the fixed amount Td, and is, for example, the amount of delay of zero. At this time, the amount of delay D1 may be equal to the fixed amount Td.

The delay line 10 assigns the amount of delay D3 to the input clock signal φCKin, and generates a delayed-phase clock signal φCK(+) which is obtained by delaying the edge timing by the fixed amount Td with respect to the reference clock signal φCKref. The amount of delay D3 is more than the amount of delay D1 by the fixed amount Td. At this time, the amount of delay D3 may be equal to 2×(fixed amount Td).

For example, if amount of delay D1=fixed amount Td, amount of delay D2=0, and amount of delay D3=2×(fixed amount Td), the multiple delay lines 10, 20, and 30 use multiple delay units DE with delay of the fixed amount Td.

That is, the delay line 10 includes two delay units DE-1 and DE-2. The delay unit DE-1 includes one terminal connected to the input terminal 2 through a node N1, and the other terminal connected to one terminal of the delay unit DE-2. The delay unit DE-2 includes the other terminal connected to an input terminal 40a of the select circuit 40. As a result, the delay line 10 can generate the delayed-phase clock signal φCK(+) by delaying the input clock signal φCKin by amount of delay D3=2×(fixed amount Td), using the two the delay units DE-1 and DE-2.

The delay line 20 includes one delay unit DE-3. The delay unit DE-3 includes one terminal connected to the input terminal 2 though the node N1, and the other terminal connected to an input terminal 40b of the select circuit 40. As a result, the delay line 20 can generate the delayed-phase clock signal φCKref by delaying the input clock signal φCKin by amount of amount of delay D1=(fixed amount Td), using one delay unit DE-3.

The delay line 30 does not include a delay unit. The delay line 30 includes one terminal connected to the input terminal 2 through the node N1, and the other terminal connected to an input terminal 40c of the select circuit 40. As a result, the delay line 30 can generate the advanced-phase clock signal φCK(−) without delay the input clock signal φCKin.

Figure 2A:
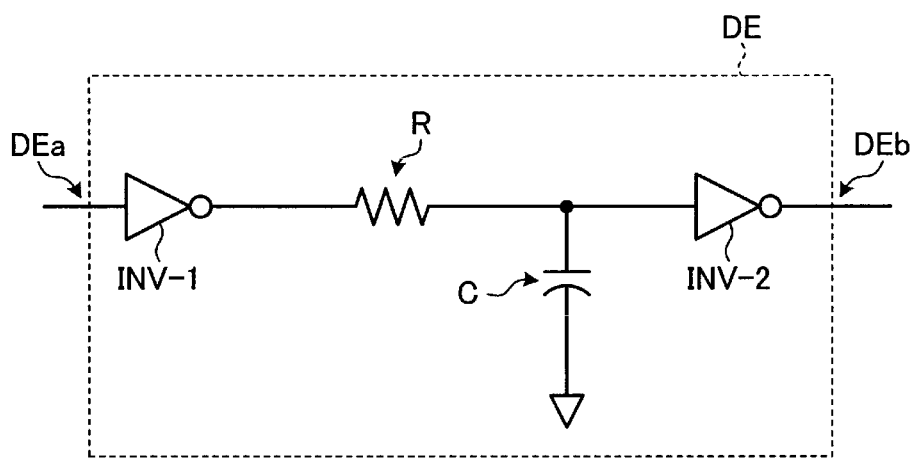
FIGS. 2A and 2B are circuit diagrams illustrating a delay unit in the clock generation circuit according to the embodiment.

For example, each delay unit DE may be configured such that the amount of delay (for example, the fixed amount Td) is generated by an inverter and an RC circuit, as illustrated in FIG. 2A. FIG. 2A is a circuit diagram illustrating a configuration of the delay unit DE. The delay unit DE illustrated in FIG. 2A includes inverters INV-1 and INV-2, a resistor element R, and a capacitor element C. The inverter INV-1 includes an input side connected to one terminal DEa of the delay unit DE, and an output side connected to one terminal of the resistor element R. The resistor element R includes the other terminal connected to one terminal of the capacitor element C and an input side of the inverter INV-2. The capacitor element C includes the other terminal connected to a ground potential. The inverter INV-2 includes an output side connected to the other terminal DEb of the delay unit DE.

Figure 2B:
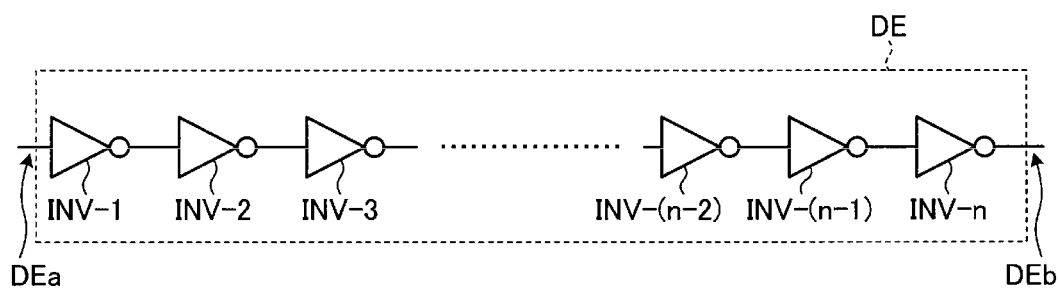

Alternatively, each delay unit DE may be configured such that the amount of delay (for example, the fixed amount Td) is generated by inverters of n stages (n is even numbers larger than or equal to 2) connected in series, as illustrated in FIG. 2B. FIG. 2B is a circuit diagram illustrating a configuration of the delay unit DE. The delay unit DE illustrated in FIG. 2B includes n inverters INV-1 to INV-n. The inverter INV-1 of a first stage includes an input side connected to the one terminal DEa of the delay unit DE, and an output side connected to an input side of the inverter INV-2 of a second stage. The inverter INV-2 of the second stage includes an output side connected to an input side of an inverter INV-3 of a third stage. An inverter INV-(n−1) of an (n−1)th stage includes an output side connected to an input side of an inverter INV-n of an nth stage. The inverter INV-n of the nth stage includes an output side connected to the other terminal DEb of the delay unit DE.

Returning to FIG. 1, the select circuit 40 is connected between the multiple delay lines 10, 20, and 30 and the output terminal 3. The select circuit 40 selects one delay line among the multiple delay lines 10, 20, and 30 in accordance with a select signal φA, and outputs a clock signal which is transferred through the selected delay line as an output clock signal φCKout.

The select circuit 40 includes input terminals 40a to 40c, a control terminal 40d, and an output terminal 40e. The input terminal 40a is connected to an output side of the delay line 10, the input terminal 40b is connected to an output side of the delay line 20, and the input terminal 40c is connected to an output side of the delay line 30. The select circuit 40 receives the delayed-phase clock signal φCK(+) at the input terminal 40a, receives the reference clock signal φCKref at the input terminal 40b, and receives the advanced-phase clock signal φCK(−) at the input terminal 40c.

The control terminal 40d is connected to the control circuit 50. The select circuit 40 receives the select signal φA with, for example, three values (0 to 2) at the control terminal 40d. If receiving the select signal φA (φA=0) which instructs selecting of the input terminal 40a, the select circuit 40 selects the delayed-phase clock signal φCK(+) to output from an output terminal 40e as the output clock signal φCKout. If receiving the select signal φA (φA=1) which instructs selecting of the input terminal 40b, the select circuit 40 selects the reference clock signal φCKref to output from the output terminal 40e as the output clock signal φCKout. If receiving the select signal φA (φA=2) which instructs selecting of the input terminal 40c, the select circuit 40 selects the advanced-phase clock signal φCK(−) to output from the output terminal 40e as the output clock signal φCKout.

The control circuit 50 controls the select circuit 40 by receiving a control signal φCS from the outside (for example, a digital circuit 170 illustrated in FIG. 6), generating the select signal φA based on the control signal φCS, and supplying the select signal φA to the select circuit 40. That is, the control circuit 50 controls the select circuit 40 such that the selected one operation is performed while one operation which is selected from the first operation and the second operation is periodically switched, with respect to the reference clock signal φCKref. Alternatively, the clock generation circuit 1 controls the select circuit 40 such that the selected one operation is performed while one operation which is selected from the first operation and the third operation is periodically switched, with respect to the reference clock signal φCKref. Alternatively, the clock generation circuit 1 controls the select circuit 40 such that the selected one operation is performed while one operation which is selected from the first operation, the second operation, and the third operation is periodically switched, with respect to the reference clock signal φCKref. The first operation includes an operation in which the edge timing of the reference clock signal φCKref is not changed. The second operation includes an operation in which the edge timing of the reference clock signal φCKref is advanced by the fixed amount Td. The third operation includes an operation in which the edge timing of the reference clock signal φCKref is delayed by the fixed amount Td.

For example, if a waveform of the reference clock signal φCKref is the waveform illustrated in (a) of FIG. 3, the control circuit 50 controls the select circuit 40 such that the first operation is performed on the rising edge in each period and the second operation, is performed on the falling edge in each period, with respect to the reference clock signal φCKref, as illustrated in waveform (b) of FIG. 3, where FIG. 3 is a waveform diagram illustrating an operation of the clock generation circuit.

That is, at timing t0, the control circuit 50 has the select signal φA=1.

At timing t01, the control circuit 50 changes the select signal from the select signal φA=1 to the select signal φA=2. According to this, the select circuit 40 is switched from a state in which the reference clock signal φCKref is selected to a state in which the advanced-phase clock signal φCK(−) is selected, and thus a falling edge of a clock signal φCKscc1 is advanced by the fixed amount Td from timing t1.

At timing t12, the control circuit 50 changes the select signal from the select signal φA=2 to the select signal φA=1. According to this, the select circuit 40 returns to a state in which the reference clock signal φCKref is selected from a state in which the advanced-phase clock signal φCK(−) is selected, and thus a rising edge of the clock signal φCKscc1 becomes the same as that of the reference clock signal φCKref at timing t2.

The control circuit 50 controls the select circuit 40 such that the select circuit 40 also repeats the same operation during clock period TP1 in other clock periods TP2 to TP4. Timings t01 and t12 are respectively earlier than timings t1 and t2 of the reference clock signal φCKref by time according to the fixed amount Td and operation time of the select circuit 40.

Alternatively, as illustrated in waveform (c) of FIG. 3, the control circuit 50 controls the select circuit 40 such that the first operation is performed on the rising edge in each period and the third operation is performed on the falling edge in each period with respect to the reference clock signal φCKref.

That is, at timing t0, the control circuit 50 has the select signal φA=1.

At timing t01, the control circuit 50 changes the select signal from the select signal φA=1 to the select signal φA=0. According to this, the select circuit 40 is switched from a state in which the reference clock signal φCKref is selected to a state in which the delayed-phase clock signal φCK(+) is selected, and thus a falling edge of a clock signal φCKscc2 is delayed by the fixed amount Td from timing t1.

At timing t12, the control circuit 50 changes the select signal from the select signal φA=0 to the select signal φA=1. According to this, the select circuit 40 returns to a state in which the reference clock signal φCKref is selected from a state in which the delayed-phase clock signal φCK(+) is selected, and thus a rising edge of the clock signal φCKscc2 becomes the same as that of the reference clock signal φCKref at timing t2.

The control circuit 50 controls the select circuit 40 such that the select circuit 40 also repeats the same operation during period TP1 in the other clock periods TP2 to TP4. Timings t01 and t12 are respectively earlier than timings t1 and t2 of the reference clock signal φCKref by the time according to the fixed amount Td and operation time of the select circuit 40.

Alternatively, as illustrated in (d) of FIG. 3, the control circuit 50 controls the select circuit 40 such that the first operation is performed on the rising edge in each period and the second operation and the third operations are alternately performed in each period with respect to the reference clock signal φCKref.

That is, at timing t0, in the control circuit 50, the select signal φA=1 is satisfied.

At timing t01, the control circuit 50 changes the select signal from the select signal φA=1 to the select signal φA=2. According to this, the select circuit 40 is switched from a state in which the reference clock signal φCKref is selected to a state in which the advanced-phase clock signal φCK(−) is selected, and thus a falling edge of a clock signal φCKscc3 is advanced by the fixed amount Td from timing t1.

At timing t12, the control circuit 50 changes the select signal from the select signal φA=2 to the select signal φA=1. According to this, the select circuit 40 returns to a state in which the reference clock signal φCKref is selected from a state in which the advanced-phase clock signal φCK(−) is selected, and thus a rising edge of the clock signal φCKscc3 becomes the same as that of the reference clock signal φCKref at timing t2.

At timing t23, the control circuit 50 changes the select signal from the select signal φA=1 to the select signal φA=0. According to this, the select circuit 40 is switched from a state in which the reference clock signal φCKref is selected to a state in which the delayed-phase clock signal φCK(+) is selected, and thus the falling edge of the clock signal φCKscc3 is delayed by the fixed amount Td from timing t3.

At timing t34, the control circuit 50 changes the select signal from the select signal φA=0 to the select signal φA=1. According to this, the select circuit 40 returns to a state in which the reference clock signal φCKref is selected from a state in which the delayed-phase clock signal φCK(+) is selected, and thus the rising edge of the clock signal φCKscc3 becomes the same as that of the reference clock signal φCKref at timing t4.

The control circuit 50 controls the select circuit 40 such that the select circuit 40 also repeats the same operation performed in clock periods TP1 and TP2 in other clock periods TP3 and TP4. Timings t01, t12, t23, and t34 are respectively earlier than timings t1, t2, t3, and t4 of the reference clock signal φCKref by the time according to the fixed amount Td and operation time of the select circuit 40.

Alternatively, as illustrated in (e) of FIG. 3, the control circuit 50 controls the select circuit 40 such that the first and second operations are alternately performed on the rising edge of each period and first and third operations are alternately performed on each falling edge in each period, with respect to the reference clock signal φCKref.

That is, at timing t0, in the control circuit 50, the select signal φA=1 is satisfied.

At timing t12, the control circuit 50 changes the select signal from the select signal φA=1 to the select signal φA=2. According to this, the select circuit 40 is switched from a state in which the reference clock signal φCKref is selected to a state in which the advanced-phase clock signal φCK(−) is selected, and thus a falling edge of a clock signal φCKscc4 is delayed by the fixed amount Td from timing t2.

At timing t23, the control circuit 50 maintains the select signal φA=2. According to this, the select circuit 40 maintains a state in which the advanced-phase clock signal φCK(−) is selected, and thus the falling edge of the clock signal φCKscc4 is advanced by the fixed amount Td from timing t3.

At timing t34, the control circuit 50 changes the select signal from the select signal φA=2 to the select signal φA=1. According to this, the select circuit 40 returns to a state in which the reference clock signal φCKref is selected from a state in which the advanced-phase clock signal φCK(−) is selected, and thus a rising edge of the clock signal φCKscc4 is the same as that of the reference clock signal φCKref at timing t4.

The control circuit 50 controls the select circuit 40 such that the select circuit 40 also repeats the same operation performed in clock periods TP1 and TP2 in other clock periods TP3 and TP4. Timings t01, t12, t23, and t34 are respectively earlier than timings t1, t2, t3, and t4 of the reference clock signal φCKref by the time according to the fixed amount Td and operation time of the select circuit 40.

Alternatively, as illustrated in (f) of FIG. 3, the control circuit 50 controls the select circuit 40 such that the first and third operations are alternately performed on the rising edge of each period and the first and third operations are alternately performed on the falling edge in each period, with respect to the reference clock signal φCKref.

That is, at timing t0, in the control circuit 50, the select signal φA=1 is satisfied.

At timing t12, the control circuit 50 changes the select signal from the select signal φA=1 to the select signal φA=0. According to this, the select circuit 40 is switched from a state in which the reference clock signal φCKref is selected to a state in which the delayed-phase clock signal φCK(+) is selected, and thus a rising edge of a clock signal φCKscc5 is delayed by the fixed amount Td from timing t2.

At timing t23, the control circuit 50 maintains the select signal φA=0. According to this, the select circuit 40 maintains a state in which the delayed-phase clock signal φCK(+) is selected, and thus a falling edge of the clock signal φCKscc5 is advanced by the fixed amount Td from timing t3.

At timing t34, the control circuit 50 changes the select signal from the select signal φA=0 to the select signal φA=1. According to this, the select circuit 40 returns to a state in which the reference clock signal φCKref is selected from a state in which the delayed-phase clock signal φCK(+) is selected, and thus the rising edge of the clock signal φCKscc5 is the same as that of the reference clock signal φCKref at timing t4.

The control circuit 50 controls the select circuit 40 such that the select circuit 40 also repeats the same operation performed clock periods TP1 and TP2 in other clock periods TP3 and TP4. Timings t01, t12, t23, and t34 are respectively earlier than timings t1, t2, t3, and t4 of the reference clock signal φCKref by the time according to the fixed amount Td and operation time of the select circuit 40.

Alternatively, as illustrated in (g) of FIG. 3, the control circuit 50 controls the select circuit 40 such that a first operation is performed on a first rising edge and first falling edge, a second operation is performed on a second rising edge and second falling edge, a first operation is performed on a third rising edge and a third falling edge and a third operation is performed on a fourth rising edge and fourth falling edge, with respect to the reference clock signal φCKref and thereafter the respective operations on the four edges are repeated.

That is, at timing t0, the control circuit 50 has the select signal φA=1.

At timing t12, the control circuit 50 changes the select signal from the select signal φA=1 to the select signal φA=2. According to this, the select circuit 40 is switched from a state in which the reference clock signal φCKref is selected to a state in which the advanced-phase clock signal φCK(−) is selected, and thus a rising edge of a clock signal φCKscc6 is delayed by the fixed amount Td from timing t2.

At timing t23, the control circuit 50 maintains the state of the select signal φA=2. According to this, the select circuit 40 maintains a state in which the advanced-phase clock signal φCK(−) is selected, and thus a falling edge of the clock signal φCKscc6 is advanced by the fixed amount Td from timing t3.

At timing t34, the control circuit 50 changes the select signal from the select signal φA=2 to the select signal φA=1. According to this, the select circuit 40 returns to a state in which the reference clock signal φCKref is selected from a state in which the advanced-phase clock signal φCK(−) is selected, and thus the rising edge of the clock signal φCKscc6 is the same as that of the reference clock signal φCKref at timing t4.

At timing t56, the control circuit 50 changes the select signal from the select signal φA=1 to the select signal φA=0. According to this, the select circuit 40 returns to a state in which the reference clock signal φCKref is selected from a state in which the delayed-phase clock signal φCK(+) is selected, and thus the rising edge of the clock signal φCKscc6 is delayed by the fixed amount Td from timing t6.

At timing t67, the control circuit 50 maintains the select signal φA=0. According to this, the select circuit 40 maintains a state in which the delayed-phase clock signal φCK(+) is selected, and thus the falling edge of the clock signal φCKscc6 is delayed by the fixed amount Td from timing t7.

At timing t78, the control circuit 50 changes the select signal from the select signal φA=0 to the select signal φA=1. According to this, the select circuit 40 returns to a state in which the reference clock signal φCKref is selected from a state in which the delayed-phase clock signal φCK(+) is selected, and thus the rising edge of the clock signal φCKscc6 is the same as that of the reference clock signal φCKref at timing t8.

The control circuit 50 controls the select circuit 40 such that the select circuit 40 also repeats the same operation as at a set of clock periods TP1 to TP4 at other sets of clock periods. Timings t01, t12, t23, t34, t56, t67, and t78 are respectively earlier than timings t1, t2, t3, t4, t6, t7, and t8 of the reference clock signal φCKref by the time according to the fixed amount Td and operation time of the select circuit 40.

Figure 4:
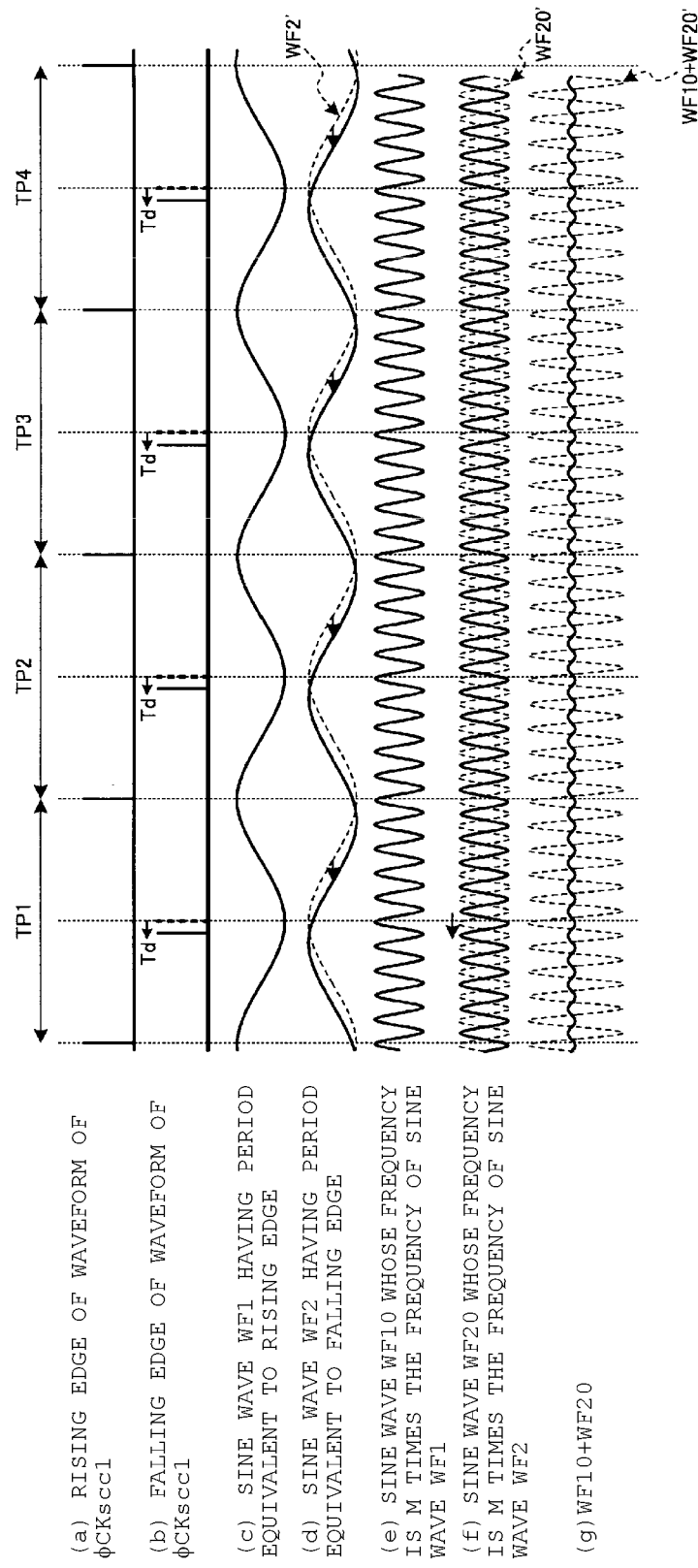
FIG. 4 illustrates cancellation of spurious.

Subsequently, a principle in which spurious components are cancelled is described, with reference to FIG. 4. FIG. 4 illustrates the principle in which spurious component is cancelled, with reference to the clock signal φCKscc1 illustrated in (b) of FIG. 3.

It is considered that propagation of spurious component is caused by a current (voltage) flowing into Vdd/Vss in accordance with a clock signal rather than the clock signal itself. For this reason, description is made by separating a spurious current into a current originating from a rising edge and a current originating from a falling edge.

For example, a waveform of the clock signal φCKscc1 includes rising edge components illustrated in (a) of FIG. 4, and falling edge components illustrated in (b) of FIG. 4. Among these, the rising edge components are the same as those of the reference clock signal φCKref (refer to (a) of FIG. 3), but the falling edge components are advanced from the falling edge of the reference clock signal φCKref by the fixed amount Td. That is, in (b) of FIG. 4, dashed lines denote falling edges of the reference clock signal φCKref, and solid lines denote falling edges of the clock signal φCKscc1. Arrows of (b) of FIG. 4 represent that the falling edges (dashed lines) of the reference clock signal φCKref are advanced by the fixed amount Td, and thereby the falling edges (solid lines) of the clock signal φCKscc1 are generated.

Behavior of the components of the rising edge illustrated in (a) of FIG. 4 can be approximately represented by a sine wave WF1 with periods equivalent to and amplitudes corresponding rising edges illustrated in (c) of FIG. 4. Behavior of the components of the falling edge illustrated in (b) of FIG. 4 can be approximately represented by a sine wave WF2 with periods equivalent to and amplitudes corresponding to falling edges denoted by a solid line of (d) of FIG. 4. That is, in (d) of FIG. 4, a dashed line illustrates a sine wave WF2' with periods equivalent to and amplitudes corresponding to falling edges of the reference clock signal φCKref, a solid line illustrates a sine wave WF2 with periods equivalent to and amplitudes corresponding to falling edges of the clock signal φCKscc1. An arrow of (d) of FIG. 4 represents that a phase of the sine wave WF2' (dashed line) advances by the fixed amount Td, whereby the sine wave WF2 (solid line) is generated.

In addition, behavior of spurious components generated from component of the rising edge illustrated in (a) of FIG. 4 can be approximately represented by a sine wave WF10 with a frequency that is M times (M is even numbers larger than or equal to 2 and M=10 in FIG. 4) the frequency of the sine wave WF1 as illustrated in (e) of FIG. 4. In the same manner, behavior of spurious components generated from component of the falling edge illustrated in (b) of FIG. 4 can be approximately represented by a sine wave WF20 with a frequency that is M times the frequency of the sine wave WF2 as denoted by a solid line of (f) of FIG. 4. That is, in (f) of FIG. 4, the solid line denotes the sine wave WF20' with a frequency that is M times the frequency of the sine wave WF2', and denotes the sine wave WF20 with a frequency that is M times the frequency of the sine wave WF2. Arrows of (f) of FIG. 4 represent that a phase of the sine wave WF20' (dashed line) advances by the fixed amount Td, whereby the sine wave WF20 (solid line) is generated.

As illustrated in (e) and (f) of FIG. 4, the sine waves WF10 and WF20' have approximately the same phase as each other. For this reason, if the sine waves WF10 and WF20' are combined with each other, spurious components reinforced each other, as denoted by a dashed line of (g) of FIG. 4. Meanwhile, as denoted by dashed lines of (e) and (f) of FIG. 4, the sine waves WF10 and WF20 have approximately reverse phases (a phase difference between a rising edge and a falling edge is 180 degrees) each other. For this reason, if the sine waves WF10 and WF20 are combined with each other, the spurious components can be cancelled with each other, as denoted by solid line of (g) of FIG. 4.

In FIG. 3, when the output clock signals are generated, a case in which one of the second operation and the third operation is performed in addition to the first operation (refer to (b), (c), (e), and (f) of FIG. 3), and a case in which the second operation and the third operation are alternately performed in addition to the first operation (refer to (d) and (g) of FIG. 3) are illustrated. The first operation includes an operation in which edge timing of the reference clock signal φCKref is not changed. The second operation includes an operation in which the edge timing of the reference clock signal φCKref advances by the fixed amount Td. The third operation includes an operation in which the edge timing of the reference clock signal φCKref is delayed by the fixed amount Td. The amount of shift of edge timing of each of the second operation and the third operation is set to the fixed amount Td, but may be varied due to the effect of variation or the like of operation characteristics of the delay unit DE in the actual operation. In contrast to this, if a case in which one of the second operation and the third operation is performed is compared with a case in which the second operation and the third operation are alternately performed, it can be seen that a case in which the second operation and the third operation are alternately performed is strong against variation of the amount of shift of the edge timing. This point is hereinafter described by using expressions.

When a clock signal is generated by performing one of the second operation and the third operation for the reference clock signal φCKref in addition to the first operation, a signal with spurious components of a predetermined frequency of the reference clock signal φCKref is summed with a signal obtained by advancing (or delaying) the edge of the reference clock signal φCKref, whereby spurious components of the predetermined frequency are cancelled. When a phase of spurious components of a predetermined frequency is referred to as θ, a phase difference (phase difference denoted by a unit of a phase (phase angle) with respect to one period of the spurious components of the predetermined frequency) corresponding to the amount of shift of the edge timing of the clock signal is referred to as φ, and amplitude without phase shift (φ=0) is 1, the expression of the summed signal is as follows.

$$f_{2waves}(\theta,\varphi) = \tfrac{1}{2} \times \sin\theta + \tfrac{1}{2} \times \sin(\theta+\varphi) \quad \text{Expression 1.}$$

Expression 1 is organized as the following Expression 2 to Expression 4.

$$f_{2waves}(\theta,\varphi) = \sqrt{[(1+\cos\varphi)/2]} \times \sin(\theta+\alpha) \quad \text{Expression 2,}$$

$$\text{When } -90° \leq \varphi < 90°,\ \alpha = \tan^{-1}[\sin\varphi/(1+\cos\varphi)] + 0 \quad \text{Expression 3,}$$

$$\text{When } 90° \leq \varphi < 270°,\ \alpha = \tan^{-1}[\sin\varphi/(1+\cos\varphi)] + \pi \quad \text{Expression 4.}$$

According to Expression 2 to Expression 4, amplitude of the synthesized signal is represented by the following Expression 5.

$$Amp_2 = \sqrt{[(1+\cos\varphi)/2]} \quad \text{Expression 5.}$$

Meanwhile, when a clock signal is generated by alternately performing (that is, performing both) the second operation and the third operation for the reference clock signal φCKref in addition to the first operation, a signal with spurious components of a predetermined frequency of the reference clock signal φCKref, a signal obtained by advancing the edge of the reference clock signal φCKref, and a signal obtained by delaying the edge of the reference clock signal φCKref are summed together, whereby spurious components of the predetermined frequency are cancelled. When a phase of the reference clock signal φCKref is referred to as θ, a phase difference between a phase of the reference clock signal φCKref and a phase of an advanced (or delayed) clock signal is referred to as φ, and amplitude without phase shift (φ=0) is 1, the expression of the summed signal (synthesized signal) is as the following Expression 6.

$$f_{4waves}(\theta,\varphi) = \tfrac{1}{2} \times \sin\theta + \tfrac{1}{2} \times \sin(\theta+\varphi) + \tfrac{1}{2} \times \sin\theta + \tfrac{1}{2} \times (\theta-\varphi)$$ Expression 6.

Expression 6 is organized as the following Expression 7.

$$f_{4waves}(\theta,\varphi) = [(1+\cos\varphi)/2] \times \sin\theta$$ Expression 7.

According to Expression 7, amplitude of the synthesized signal is represented by the following Expression 8.

$$Amp_4 = \sqrt{[(1+\cos\varphi)/2]}$$ Expression 8.

Figure 5:
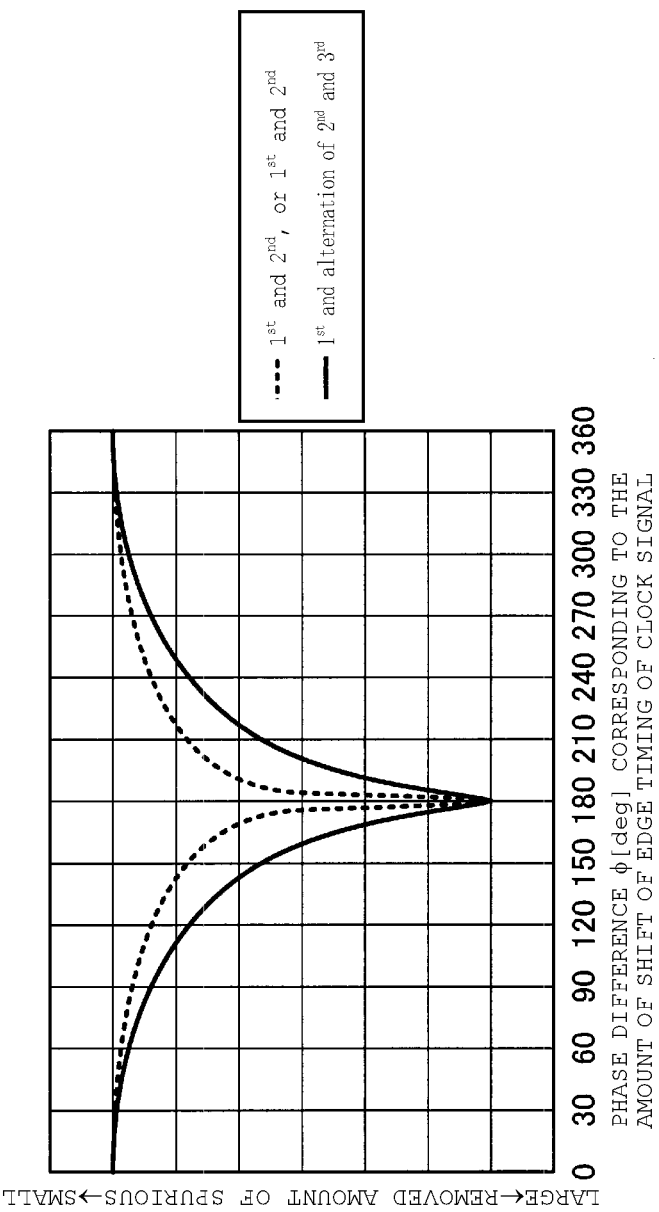
FIG. 5 illustrates amount of cancelled spurious depending on amount of phase shift.

FIG. 5 is obtained by plotting the phase difference φ corresponding to the amount of shift of the edge timing of the clock signal and the removed amount of the spurious, using Expression 5 (one) and Expression 8 (alternating). FIG. 5 is a diagram illustrating an operation of the clock generation circuit 1. It can be seen from FIG. 5 that, also in both of a case in which one of the second operation and the third operation is performed for the reference clock signal φCKref in addition to the first operation, and a case in which the second operation and the third operation are alternately (that is, both) performed, when the phase difference corresponding to the amount of shift of the edge timing of the clock signal is 180 degrees, the amount of attenuation of the spurious components is maximum.

For example, if a frequency at which the spurious components should be cancelled is referred to as $f_{spur}$, a relationship of following Expression 9 is satisfied between a phase difference φ corresponding to the amount of shift of the edge timing of the clock signal and the amount of shift, that is, the fixed amount Td obtained by advancing or delaying a rising/falling edge.

$$\varphi = Td \times f_{spur} \times 360°$$ Expression 9

Following Expression 10 is obtained by inserting φ=180° into Expression 9 to calculate the Td that causes a cancellation.

$$Td = 1/(2f_{spur})$$ Expression 10

In FIG. 5, it can be seen that the spurious components can be efficiently cancelled in a case in which the clock signal is generated by alternately performing the second operation and the third operation (for example, a case of (d) and (g) of FIG. 3), compared to a case in which the clock signal is generated by performing one of the second operation and the third operation for the reference clock signal φCKref in addition to the first operation (for example, a case of (b), (c), (e), (f) of FIG. 3).

Figure 6:
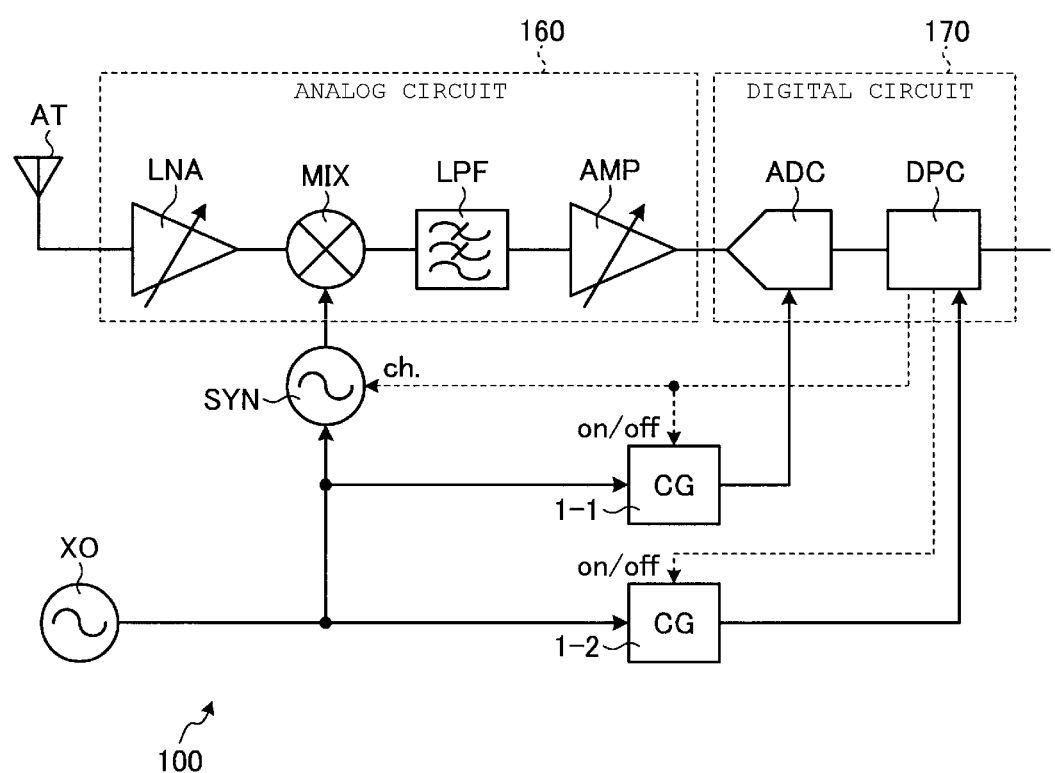
FIG. 6 is a circuit diagram illustrating a wireless receiving device including the clock generation circuit according to the embodiment.

Subsequently, a wireless receiving device 100 to which the clock generation circuit 1 is applied is described with reference to FIG. 6. FIG. 6 is a diagram illustrating a configuration of the wireless receiving device 100.

The wireless receiving device 100 includes an antenna AT, an analog circuit 160, a digital circuit 170, an original oscillator XO, a local oscillation circuit SYN, and clock generation circuits 1-1 and 1-2. The analog circuit 160 includes a low noise antenna LNA, a mixer MIX, a low pass filter LPF, and a variable amplifier AMP. The digital circuit 170 includes an AD converter ADC and a digital processing circuit DPC. In the wireless receiving device 100, the clock generation circuits 1-1 and 1-2 are respectively provided with respect to the AD converter ADC and the digital processing circuit DPC, and are configured such that operations of modulating the clock signal can be on/off separately from each other.

Figure 7A:
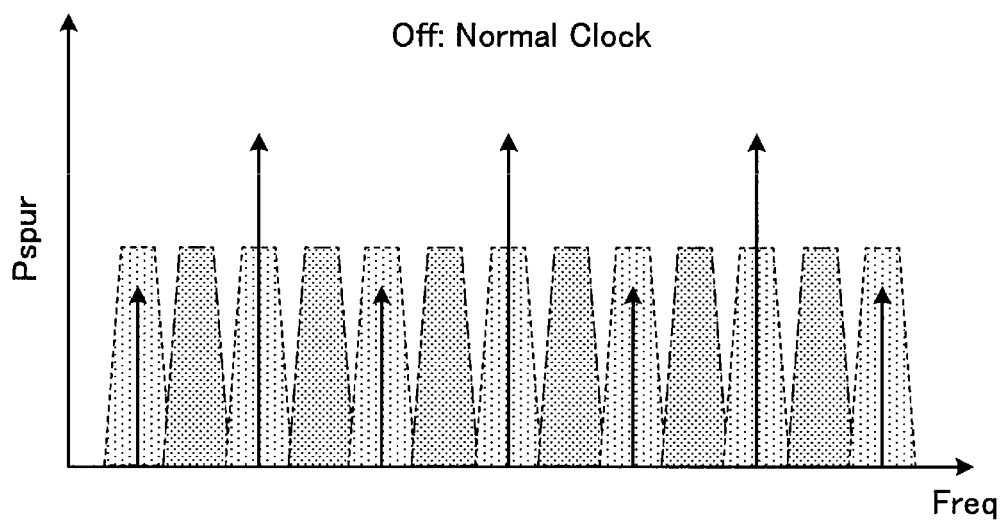
FIGS. 7A and 7B illustrate levels of wireless signals and spurious when a clock modulation operation of the clock generation circuit according to the embodiment is not carried out and carried out, respectively.
Figure 7B:
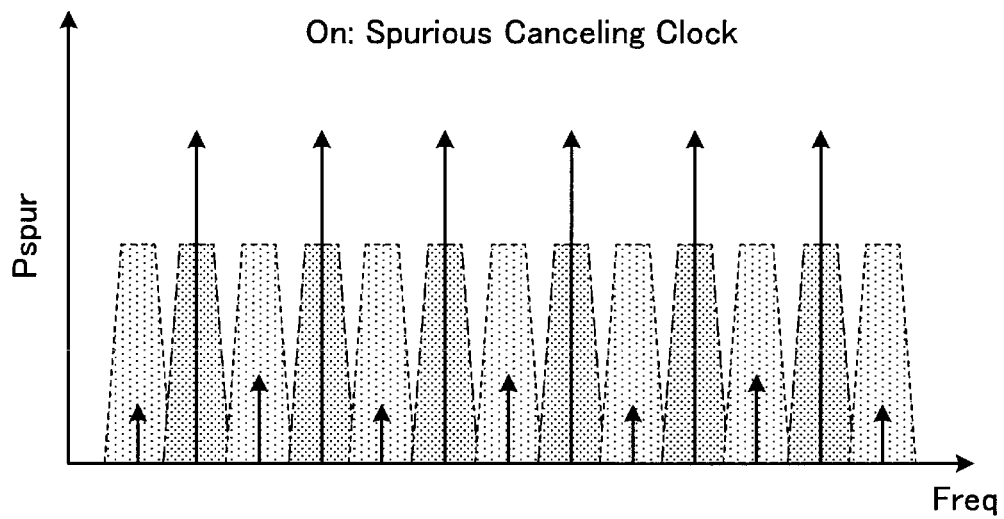

In the wireless receiving device 100, if clock modulation operations of the clock generation circuits 1-1 and 1-2 are off, spurious components denoted by arrows of FIG. 7A can be generated. In contrast to this, if clock modulation operations are on, spurious components denoted by arrows of FIG. 7B can be generated. FIGS. 7A and 7B are respectively diagram illustrating an operation of the wireless receiving device 100, a vertical axis denotes power, and a horizontal axis denotes a frequency. When the clock modulation operation is on (FIG. 7B), extraneous spurious components are newly generated at a frequency which is not generated when the clock modulation operation is off (FIG. 7A). For this reason, a function of making the clock modulation operations of the clock generation circuits 1-1 and 1-2 on/off is effective according to the frequency bands to be used.

For example, if a receiving channel is a signal denoted by a one-dotted chain line of FIG. 7A, a frequency with the spurious components denoted by arrows does not overlap a frequency of a desired signal. FIGS. 7A and 7B are diagrams illustrating an operation of the wireless receiving device 100. For this reason, the digital processing circuit DPC controls the clock generation circuits 1-1 and 1-2 such that the clock modulations performed by the clock generation circuits 1-1 and 1-2 are off. The clock generation circuits 1-1 and 1-2 continuously output the reference clock signal φCKref (refer to (a) of FIG. 3). Meanwhile, if a receiving channel is a signal denoted by a dashed line of FIG. 7B, the frequency with the spurious components denoted by the arrows overlaps a frequency of a desired signal. For this reason, the digital processing circuit DPC controls the clock generation circuits 1-1 and 1-2 such that the clock modulations performed by the clock generation circuits 1-1 and 1-2 are on. The clock generation circuits 1-1 and 1-2 output clock signals (refer to (b) to (g) of FIG. 3) obtained by modulating the reference clock signal φCKref.

Alternatively, for example, if a signal level is high and the effect of spurious components on receiving signal decreases, necessity for modulating the clock signal decreases. For this reason, the digital processing circuit DPC controls the clock generation circuits 1-1 and 1-2 such that the clock modulations performed by the clock generation circuits 1-1 and 1-2 are off. The clock generation circuits 1-1 and 1-2 continuously output the reference clock signal φCKref (refer to (a) of FIG. 3). Meanwhile, if a signal level is low and the effect of spurious components on a receiving signal increases, necessity for modulating the clock signal increases. For this reason, the digital processing circuit DPC controls the clock generation circuits 1-1 and 1-2 such that the clock modulations performed by the clock generation circuits 1-1 and 1-2 are on. The clock generation circuits 1-1 and 1-2 output clock signals (refer to (b) to (g) of FIG. 3) obtained by modulating the reference clock signal φCKref.

As described above, in the embodiment, modulation is performed in which a phase of the edge timing of the clock signal to be generated by the clock generation circuit 1 is advanced and/or delayed by the fixed amount Td (for example, $1/(2f_{spur})$) corresponding to a desired frequency $f_{spur}$ with respect to the reference clock signal φCKref. As a result, it is possible to effectively cancel the spurious components of a band of a desired frequency.

The clock generation circuit 1 may have a configuration in which, if one of advancing and delaying a phase by the fixed amount Td with respect to the reference clock signal φCKref is performed, an unused delay line among the multiple delay lines 10 to 30 is omitted. For example, if the clock signal φCKscc1 illustrated in (b) of FIG. 3 or the clock signal φCKscc4 illustrated in (e) of FIG. 3 is generated as the output clock signal φCKout, the clock generation circuit 1 may have a configuration in which the delay line 10 is omitted. Alternatively, if the clock signal φCKscc1 illustrated in (c) of FIG. 3 or the clock signal φCKscc4 illustrated in (f) of FIG. 3 is generated as the output clock signal φCKout, the clock generation circuit 1 may have a configuration in which the delay line 30 is omitted.

Figure 8:
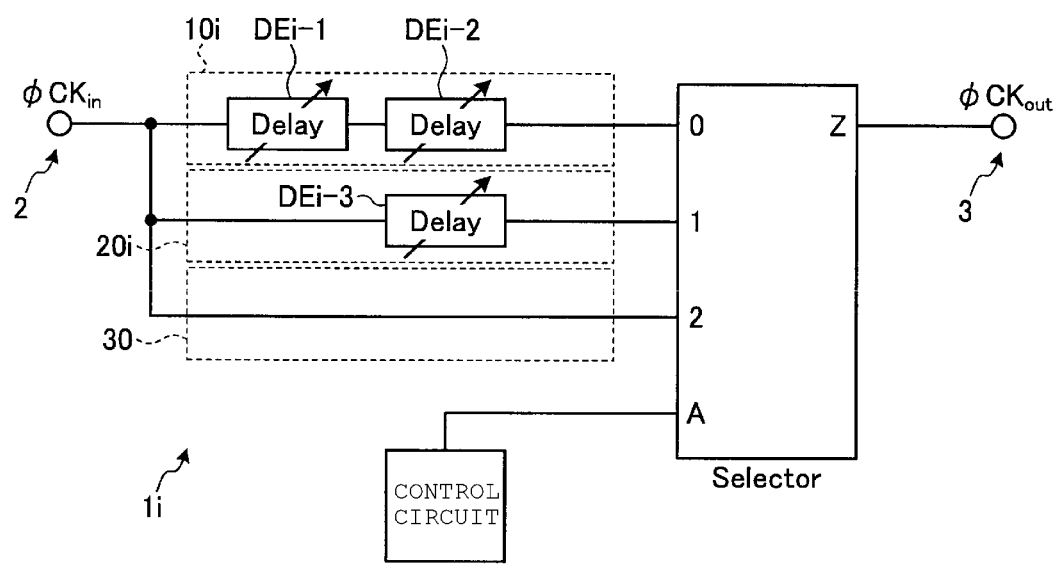
FIG. 8 is a circuit diagram illustrating the clock generation circuit according to a modification example.

Alternatively, in a clock generation circuit $1i$, the amount of delay of each delay unit DEi may vary by considering manufacturing variation of each delay unit DEi, as illustrated in FIG. 8. FIG. 8 is a circuit diagram illustrating a configuration of the clock generation circuit $1i$. For example, if the amount of delay of the delay units DEi-1 to DEi-3 is shifted from the fixed amount Td, the amount of delay of the delay units DEi-1 to DEi-3 is changed so as to match the amount of delay corresponding to the fixed amount Td.

Figure 9A:
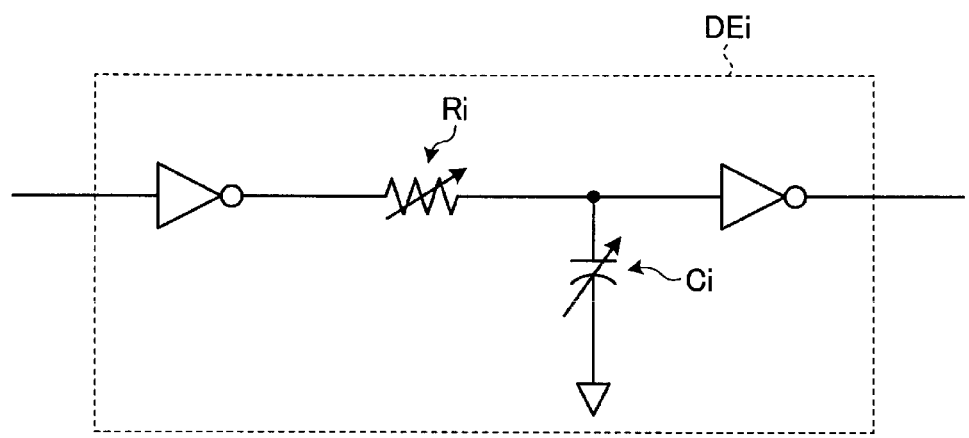
FIGS. 9A and 9B are circuit diagrams illustrating a delay unit in the clock generation circuit according to the modification example.
Figure 9B:
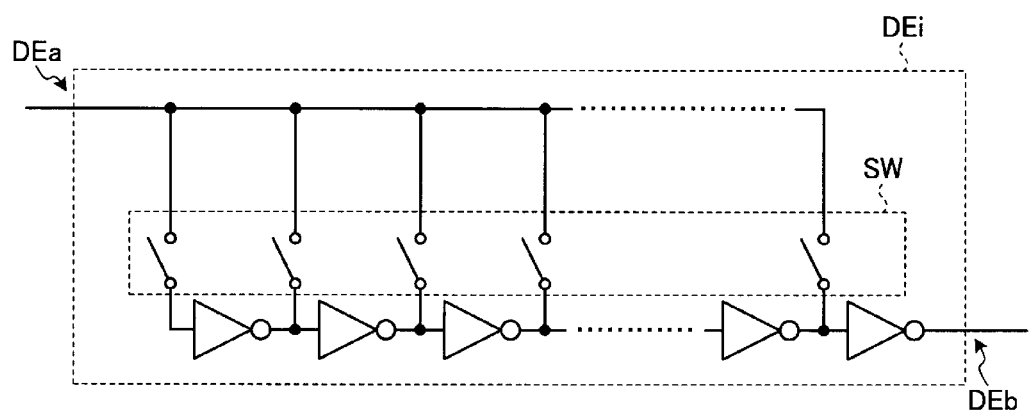

For example, as illustrated in FIG. 9A, each delay unit DEi may have a configuration in which the resistor element R and the capacitor element C are respectively replaced with a variable resistor element Ri and a variable capacitor element Ci, with respect to a configuration illustrated in FIG. 2A. FIGS. 9A and 9B are circuit diagrams illustrating configurations of a delay unit DEi.

Alternatively, as illustrated in FIG. 9B, each delay unit DEi may have a configuration in which a switching circuit SW that switches the number of stages of inverters to be passed through between one terminal DEa and the other terminal DEb is provided between the one terminal DEa and the inverters of n stages, with respect to a configuration illustrated in FIG. 2B.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A clock circuit, comprising:
  a selector circuit connected to an output terminal;
  first, second, and third paths connected in parallel between an input terminal for receiving an input clock signal and the selector circuit, a first clock signal output from the first path being delayed with respect to a second clock signal output from the second path by a predetermined length of time, and the second clock signal being delayed with respect to a third clock signal output from the third path by the predetermined length of time; and
  a control circuit configured to control the selector circuit to switch among at least two of the first, second, and third clock signals, wherein
  a non-modulated clock signal is output from the output terminal when a modulation function of the clock circuit is turned off, and a modulated clock signal is output from the output terminal when the modulation function is turned on.

2. The clock circuit according to claim 1, wherein two delay units are connected along the first path, one delay unit is connected along the second path, and no delay unit is connected along the third path.

3. The clock circuit according to claim 1, wherein the control circuit is configured to control the selector circuit to switch between the second clock signal and the third clock signal, such that the modulated clock signal output from the output terminal has rising edges same as rising edges of the second clock signal and falling edges earlier than falling edges of the second clock signal by the predetermined length of time.

4. The clock circuit according to claim 1, wherein the control circuit is configured to control the selector circuit to switch between the first clock signal and the second clock signal, such that the modulated clock signal output from the output terminal has rising edges same as rising edges of the second clock signal and falling edges delayed from falling edges of the second clock signal by the predetermined length of time.

5. The clock circuit according to claim 1, wherein the control circuit is configured to control the selector circuit to switch among the first, second, and third clock signals, such that the modulated clock signal output from the output terminal has rising edges same as rising edges of the second clock signal, and alternately a falling edge earlier than a falling edge of the second clock signal by the predetermined length of time and a falling edge delayed from a falling edge of the second clock signal by the predetermined length of time.

6. The clock circuit according to claim 1, wherein the control circuit is configured to control the selector circuit to switch between the second clock signal and the third clock signal, such that the modulated clock signal output from the output terminal has alternately a pulse same as a pulse of the second clock signal and a pulse earlier than a pulse of the second clock signal by the predetermined length of time.

7. The clock circuit according to claim 1, wherein the control circuit is configured to control the selector circuit to switch between the first clock signal and the second clock signal, such that the modulated clock signal output from the output terminal has alternately a pulse same as a pulse of the second clock signal and a pulse delayed from a pulse of the second clock signal by the predetermined length of time.

8. The clock circuit according to claim 1, wherein the control circuit is configured to control the selector circuit to switch among the first, second, and third clock signals, such that the modulated clock signal output from the output terminal repetitively has a pulse same as a pulse of the second clock signal, a pulse earlier than a pulse of the second clock signal by the predetermined length of time, a pulse same as a pulse of the second clock signal, and a pulse delayed from a pulse of the second clock signal by the predetermined length of time, in this order.

9. The clock circuit according to claim 1, wherein the predetermined length of time is set to be equal to $1/(2 \times f_{spur})$, $f_{spur}$ being a frequency of a spurious signal to be removed.

10. The clock circuit according to claim 1, wherein the predetermined length of time is varied through a control signal from the control circuit.

11. The clock circuit according to claim 1, wherein the non-modulated clock signal comprises the second clock signal, and the modulated clock signal comprises a portion of each of the first and second clock signals, a portion of each of the second and third clock signals, or a portion of each of the first, second, and third clock signals.

12. A wireless communication module, comprising:
an antenna;
an analog processing circuit configured to process an analog signal from the antenna;
a digital processing circuit configured to convert the analog signal to a digital signal and process the digital signal; and
a clock generation circuit configured to output a clock signal to the digital processing circuit, wherein
a non-modulated clock signal is output from the clock generation circuit when a modulation function thereof is turned off, and a modulated clock signal is output from the clock generation circuit when the modulation function is turned on.

13. The wireless communication module according to claim 12, wherein
modulation of the clock signal causes a spurious signal within a frequency range of signals to be received by the antenna to decrease.

14. The wireless communication module according to claim 13, wherein
modulation of the clock signal causes a spurious signal outside the frequency range of the signals to be received by the antenna to increase.

15. The wireless communication module according to claim 12, wherein
the clock generation circuit includes:
a selector circuit connected to an output terminal;
first, second, and third paths connected in parallel between an input terminal for receiving an input clock signal and the selector circuit, a first clock signal output from the first path being delayed with respect to a second clock signal output from the second path by a predetermined length of time, and the second clock signal being delayed with respect to a third clock signal output from the third path by the predetermined length of time; and
a control circuit configured to control the selector circuit to switch among at least two of the first, second, and third clock signals.

16. The wireless communication module according to claim 12, wherein
the second clock signal is output from the clock generation circuit as the non-modulated clock signal.

17. The wireless communication module according to claim 12, wherein
a portion of the second clock signal which is repeated and at least one of a portion of the first clock signal and a portion of the third clock signal are output from the clock generation circuit as the modulated clock signal.

18. A method of reducing a spurious signal within a frequency range of digital signals to be processed, comprising:
generating a clock signal;
modulating the clock signal, such that at least one of rising edges or falling edges become earlier than rising edges or falling edges of the generated clock signal or delayed from the rising edges or falling edges of the generated clock signal, by a predetermined length of time; and
processing digital signals based on the modulated clock signal, wherein
the predetermined length of time is equal to $1/(2 \times f_{spur})$, $f_{spur}$ being a frequency of the spurious signal to be removed.

19. The method according to claim 18, wherein
the clock signal is modulated by passing the generated clock signal through each of first, second, and third paths, a clock signal passing through the first path being delayed with respect to a clock signal passing through the second pass by the predetermined length of time, and the clock signal passing through the second pass being delayed by a clock signal passing through the third path by the predetermined length of time, and switching among at least two of the clock signals passing through the first, second, and third paths.

20. The method according to claim 18, further comprising:
changing the predetermined length of time in accordance with the frequency range of digital signals to be processed.

* * * * *